United States Patent
Silber et al.

(10) Patent No.: US 6,495,864 B1
(45) Date of Patent: Dec. 17, 2002

(54) HIGH-VOLTAGE SEMICONDUCTOR COMPONENT, METHOD FOR THE PRODUCTION AND USE THEREOF

(75) Inventors: Dieter Silber, Obertshausen; Wolfgang Wondrak, Frankfurt am Main; Robert Plikat, Eningen, all of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/700,357

(22) PCT Filed: May 10, 1999

(86) PCT No.: PCT/DE99/01410

§ 371 (c)(1),
(2), (4) Date: Jan. 11, 2001

(87) PCT Pub. No.: WO99/59208

PCT Pub. Date: Nov. 18, 1999

(30) Foreign Application Priority Data

May 11, 1998 (DE) .......................................... 198 20 956

(51) Int. Cl.⁷ ...................... H01L 29/74; H01L 31/111
(52) U.S. Cl. ..................................... 257/141; 257/144
(58) Field of Search ................................ 257/141, 144, 257/139, 140

(56) References Cited

U.S. PATENT DOCUMENTS

| 5,559,348 A | * | 9/1996 | Watabe et al. |
| 5,569,941 A | * | 10/1996 | Takahashi |
| 5,587,595 A | * | 12/1996 | Neubrand et al. |
| 5,640,040 A | | 6/1997 | Nakagawa et al. |
| 5,731,603 A | * | 3/1998 | Nakagawa et al. |
| 6,111,289 A | * | 8/2000 | Udrea |

FOREIGN PATENT DOCUMENTS

| DE | 19533 956 A1 | | 3/1996 |
| EP | 0 519 741 | | 12/1992 |
| EP | 0563952 A1 | * | 6/1993 |

* cited by examiner

Primary Examiner—Stephen D. Meier
(74) Attorney, Agent, or Firm—Herbert Dubno

(57) ABSTRACT

The invention concerns a semiconductor component with at east one lateral region which is provided to accommodate a lateral electric field strength, whereby the semiconductor body within the body and/or in regions proximal to the surface of the semiconductor body at least over regions thereof has a lateral three-dimensional structure which has vertical recesses in the semiconductor body within which there are electrical conductors which are smaller than in the intervening spaces of the semiconductor body between the recesses, as well as a method for making and of using the semiconductor component.

37 Claims, 2 Drawing Sheets

HIGH-VOLTAGE SEMICONDUCTOR COMPONENT, METHOD FOR THE PRODUCTION AND USE THEREOF

CROSS REFERENCE TO RELATED APPLICATIONS

This application is a national stage of PCT/DE99/01410 filed May 10, 1998 under the International Convention

FIELD OF THE INVENTION

The invention relates to a semiconductor component with at least one lateral component for accommodating a lateral electric field strength, and to a method of making the semiconductor component and the use thereof.

BACKGROUND OF THE INVENTION

In DE-A1-42 33 773 a microelectronic component in so-called SOI (Semiconductor-On-Insulator) technology is disclosed which has an enhanced breakdown voltage. The semiconductor component has a lateral component in a semiconductor body with a substrate whereby a dielectric zone is delimited on the substrate in which an electrically conductive region is embedded. The arrangement requires a technologically expensive adjustment of the buried structure with respect to the lateral component.

Furthermore, lateral as well as vertical components have been proposed which have on their surfaces structures which are provided to reduce the surface field strength to enhance the breakdown voltage. Such field plates or field rings also, however, give rise to an excessive technological cost in the production of such components.

OBJECT OF THE INVENTION it is the object of the invention to provide a semiconductor component and a method of making it which provides improved components with reference to the prior art described at the outset and especially affords higher breakdown voltages.

SUMMARY OF THE INVENTION a semiconductor component of the invention has a semiconductor body and, at least in regions on this body and/or in layers disposed upon one another. The semiconductor body and/or in regions proximal to the surface of the semiconductor body at least in portions thereof there is a lateral three-dimensional structure which has vertical recesses in the semiconductor body within which the electrical conductivity is smaller than in the intervening spaces of the semiconductor body between the recesses.

A semiconductor component according to the invention has, in the semiconductor body and/or at least regionally in a surface-neighboring region of the semiconductor body a lateral three-dimensional structure which has vertical recesses in the semiconductor body in the interior of which the electrical conductivity is less than in the intervening spaces of the semiconductor body between the recesses.

In a preferred embodiment the semiconductor component is a lateral component with a dielectric zone bounding a substrate and between the dielectric zone and the semiconductor body the lateral three-dimensional structure is provided over at least a portion of the lateral component and is directly connected with the dielectric zone.

In an advantageous embodiment of the invention the three-dimensional structure has islands or lands which are separated by vertical recesses from one another, whereby the electrical conductivity in the recesses is less than that in the islands or lands.

In a further advantageous embodiment of the invention the three-dimensional structure has ribs which are separated from one another by vertical recesses and whereby the electrical conductivity in the recesses is less than that in the ribs.

Advantageously in the semiconductor body over at least a region thereof a semiconductor of another material, especially polycrystalline material, can be disposed and which bounds the dielectric zone.

Advantageously, between the substrate and the dielectric zone, at least over a region thereof, a lateral semiconductor layer is provided.

In a further advantageous arrangement, between the substrate and the dielectric zone, at least over a region thereof, a lateral insulating layer is provided.

Advantageously, with a lateral component at least over a region, the width of the recesses in an imaginary sectional plane perpendicularly through the lateral component is smaller than 10% of the lateral drift stretch of the lateral component.

In a preferred embodiment, in a lateral component at least over a portion thereof, the width of the intervening spaces or interstices between neighboring recesses in an imaginary sectional plane perpendicularly through the lateral component is somewhat smaller than 30% of the lateral drift stretch.

An advantageous configuration of the invention provides that at least over part of the component, recesses in an imaginary sectional plane perpendicularly through the semiconductor component are approximately equidistant. This simplifies the manufacture of the component since no expensive technology steps are required and especially no adjustment of the structure relative to the lateral component is necessary.

A further preferred embodiment of the invention has at least in part a varying density of the recesses in an imaginary sectional plane perpendicularly through the semiconductor component. The breakdown voltage can be further increased in that the density of the recesses in different regions of the semiconductor body differs. It is especially advantageous below different functional regions of the component to provide different densities of the recesses.

Advantageously at least partially, the depths of the recesses can be greater than their breadths. At least in part the widths of the recesses can be smaller than the thickness of the dielectric zone. The special advantage is that with a comparable locking voltage the thickness of the dielectric zone of a component according to the invention can be smaller than with a conventional component. The thermal dissipation in the component according to the invention is improved as is the ability of the component according to the invention to withstand transitionally higher electric powers. It is also advantageous to provide at least in part widths of the recesses so that they will be smaller than the widths of the regions of the semiconductor body between the recesses.

The semiconductor body between the recesses represents zones which are interrupted by the recesses and in which electron or hole channels are formed and which in their electrostatic effects are already slightly removed from the region in which a continuous charge distribution appears so that field gradients and/or space charge zone curvature are reduced, thereby giving rise to an increase in the breakdown voltage.

An advantageous arrangement provides for the invention a semiconductor component with an edge structure for reducing the surface field strength of the component, whereby the edge structure on or in an outer surface of the semiconductor body at least neighboring an effective region of a space charge zone near the surface is arranged at a blocking contact in the semiconductor body whereby the semiconductor body at least in part at a surface has a lateral three-dimensional structure with vertical recesses in the interior of which the electrical conductivity is less than that of the semiconductor body.

In the method according to the invention for producing a component with a semiconductor body and a substrate, on a surface of the semiconductor body which is juxtaposed with the lateral component, initially at least in part, recesses are etched, the recesses are then filled with a material which is more highly ohmic than the material of the semiconductor body between the recesses and covered with a layer of a dielectric material and at least indirectly bonded with the substrate or provided with an oxide for connection with the surface of a substrate provided on the semiconductor body and at least partially provided with recesses in the oxide and filled with a semiconductor material and then covered with a layer of a semiconductor material and the covering layer at least indirectly arranged with the semiconductor body.

In a further process according to the invention for producing a component with an edge structure, recesses are provided at least partially in the surface of the semiconductor body whereby the recesses are filled with a dielectric or the surface of the semiconductor body is at least partially coated with an oxide, whereby recesses are formed in the oxide and filled with semiconductor material.

Especially advantageously, the recesses are applied substantially homogeneously over the surface region or entire semiconductor wafer. The advantage of the method of the invention is that no extensive technology is necessary for producing the lateral structure and especially there is no need for adjustment with respect to the lateral and/or vertical component in the semiconductor body.

The advantage of the lateral structure is that a field intensity in the semiconductor body or on the surface, the semiconductor body can be partly shielded so that the blocking behavior of the component is improved. The structure of the invention is especially suitable for components on a SOI basis (silicon-on-insulator) and also for vertical or lateral components which have field strength-reducing structures on the surface for reducing a surface field strength and/or the curvature of space-charge zones. Especially advantageous is the use of the invention in combination with field plates or field ring-like structures at the surface. Advantageous is the use of a component with lateral three-dimensional structuring in a driver circuit for power electronic converter systems. The voltage stability can be easily raised above 500 V so that use in networks with higher voltages, especially 220 volt networks or 380 volt three-phase networks, is possible.

BRIEF DESCRIPTION OF THE DRAWING

The features which are important to the invention are described below in greater detail with reference to the accompanying drawing. In the drawing.

SPECIFIC DESCRIPTION

In the following exemplary embodiment the invention is described in conjunction with a bipolar IGBT component. It will be understood however that the solution according to the invention is suitable at least for micro-electronic lateral components in which the so-called back-gate problem arises, like diodes or transistors, but especially also components of the IGBT type of various sorts of IGBTs and/or components of the thyristor type of various sorts of thyristor components in which back-gate problems are especially pronounced.

Figure 1:
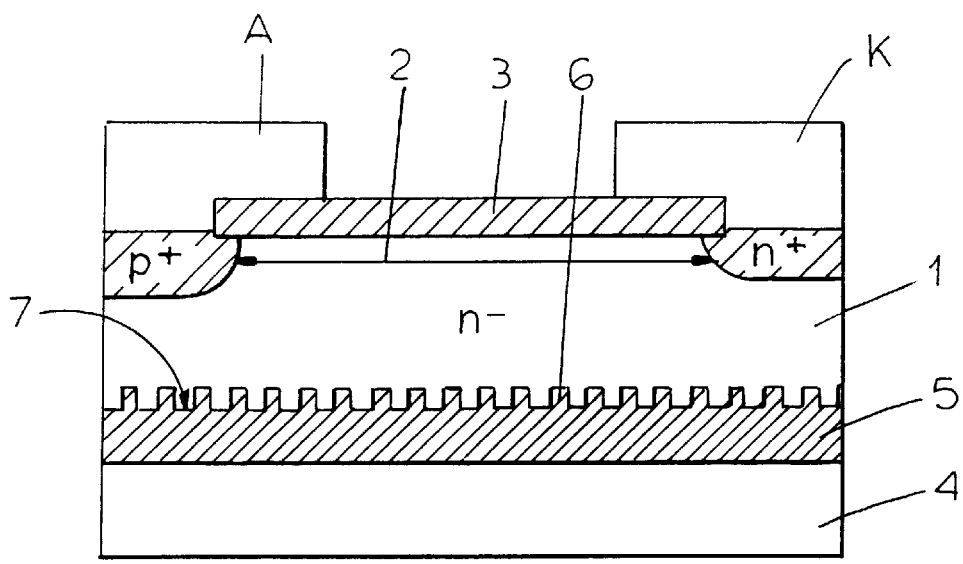
FIG. 1 is a diagram of a component according to the invention of the IGBT type.

In FIG. 1 an embodiment of the invention is illustrated in a diagram of a bidirectional insulated gate-bipolar-transistor component (IGBT). In a semiconductor body 1, a lateral component with an anode terminal A and cathode terminal K as main electrodes has been shown on the outer surface of the semiconductor body. Below the anode terminal A is a $p^+$ doped region, under the cathode terminal K is a $n^+$ doped region, each disposed in the region of the surface.

Between the main electrodes there is found the drift stretch 2 of the lateral component. This is covered with a layer, especially an oxide 3. The semiconductor body 1 outside the doped-region has a $n^-$ doping. Between the semiconductor body 1 and substrate 4 a zone is disposed which has, on the substrate side, a dielectric zone 5 delimited by a lateral three-dimensional structure whereby recesses 6 extend into the semiconductor body. The electrical conductivity within the recesses 6 is less than that of the intervening spaces 7 between the recesses, the intervening spaces 7 forming part of the semiconductor body 1. To avoid clutter, only one recess of the recesses 6 and only one intervening space 7 has been labeled.

The recesses 6 are filled with a material that has a lower electrical conductivity than the material in the intervening spaces 7. Preferably the recesses can be filled with the same dielectric material which forms the dielectric zone 5 bounding them. Correspondingly, the intervening spaces 7 can be formed from the same semiconductor material as the semiconductor body 1. It is, however, also possible to fill the recesses with another dielectric material than that of the dielectric zone or even with a semi-insulator material.

In an advantageous configuration, between the semiconductor body 1 and the dielectric zone 5, a further semiconductor material is arranged, preferably one with a greater energy-band spacing from the valence and conductivity band. In an especially advantageous combination, the semiconductor is composed of silicon and the region between the semiconductor body 1 and the dielectric zone 5 of silicon carbide. Such a material combination additionally supports the advantageous effect of the invention with respect to enhancement of the breakdown voltage.

If the semiconductor body is arranged on a separate substrate wafer 4 as is customary, especially in the case of so-called Sol components (silicon-on-insulator), the lateral three-dimensional structure 6, 7 can be fabricated in the semiconductor body 1 as well as in the substrate wafer 4.

Preferably in the back side of the semiconductor body 1, which lies opposite the front side with the lateral component, recesses 6 are provided, especially by etching. In addition, the recesses 6 can be filled with an oxide, especially silicon oxide, whereby a thicker oxide layer can finally cover the recesses 6 completely. The layer is then planarized and forms the dielectric zone 5. On this, a substrate wafer is arranged, especially by the so-called silicon direct-bonding process.

It is, however, also possible not to planarize the dielectric zone 5 itself but to coat this zone with a semiconductor, especially polycrystalline silicon and then to planarize this layer. This is advantageous when the dielectric material is difficult to polish up or to machine. The substrate is then bonded with the planarized semiconductor layer. It is also possible to completely skip a planarizing step.

A further advantageous arrangement resides in the oxidation of a wafer provided as the substrate 4 at least at its surface for bonding or to coat it with an oxide and then bond it with the dielectric zone 5.

A further advantageous arrangement oxidizes a wafer forming the substrate 4 and introduces buried portions into the wafer oxide which are full with semiconductor material, especially polycrystalline silicon. The buried portions can be covered with a further semiconductor material and planarized and then bonded with the semiconductor body 1. In this case, a boundary layer is provided between the semiconductor body 1 and the semiconductor material of the lateral three-dimensional structure, the buried portions in the wafer oxide corresponding to the intervening spaces 7 and the regions between the buried portions in the wafer oxide corresponding to the recesses 6 in the semiconductor body.

The recesses 6 of the lateral three-dimensional structure 6, 7 according to the invention constitute in substance interruptions of a buried channel in the channel section which is formed by the intervening spaces 7 of the semiconductor body and enable there a lateral voltage drop. At large spacings, these channel segments 7 act like a continuous distribution of charge carriers. A recess 6 interrupts a channel in a channel segment so that on one side of the intervening space 7, charge carriers, e.g. holes in an n-doped semiconductor body 1, collect when a lateral voltage is applied. The charge carriers on the side shield the region from potentials of the substrate and the field strength, which arises because of the difference in electrical potentials of the semiconductor body 1 and the substrate 4 in the semiconductor body 1, is low.

In the case where the diffusion current and the current induced by the electric field compensate, the resulting hole current is brought to zero. If there is an increase in the voltage drop across the recess 6, the field component of the current, from a limiting voltage, is nevertheless sufficient that the charge carriers flow in the direction of the cavity in the next intervening space 7. If the charge carriers of the channel segments are drawn off, the space charge zone widens and the electric field strength is high. If the width of the intervening space 7 is too great, a shock ionization can spread which, however, can be reduced by a reduction in the width of the intervening space, i.e. an increase in the number of recesses 7 and a shock ionization can then only arise at the component surface. A potential jump between the substrate 4 and the semiconductor body can be absorbed to a considerable extent by the dielectric zone 5 while the electrical potential in the semiconductor 1 also laterally increases.

The individual channel segments can with increasing voltage between anode and cathode and with a spreading space-charge zone, accommodate voltage so that field gradients and the curvature of the space-charge zone in the same conductor body are reduced. Thus the blocking voltage of the component is increased.

It is especially advantageous when the dimension of the depth of the recess 6 is greater than the breadth of the recess. It is also advantageous to select an intervening space 7 which is wider than the breadth of the recesses 6. A desirable dimensioning for the recesses 6 and intervening space 7 is present in a lateral component when the breadth of the recesses 6 in an imaginary sectional plane perpendicular or vertically through the lateral components (for example, the image plane in FIG. 1) is at most 10% of the lateral drift stretch 2 of the lateral component. Prefer-ably the intervening spaces 7, i.e. the distance between two directly-neighboring recesses 6, are smaller than 30% of the lateral drift stretches 2.

Figure 2:
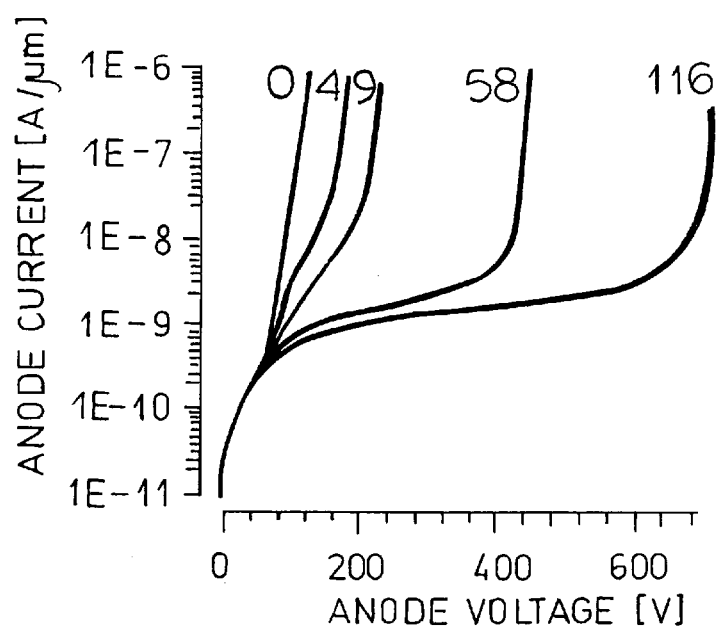
FIG. 2 is a graph of the characteristic of the blocking current of a component with and without the structure according to the invention.

The more recesses 6 that are provided and thus the greater the number of intervening spaces 7 disposed below the lateral component, the stronger is the effect on increasing the breakdown voltage. This is shown in FIG. 2. In the Figure, curves are depicted which represent the course of the blocking current as a function of applied voltage. As the variable, the number of recesses 6 below the lateral component is given. From about four recesses 6, an effect on the blocking current can be recognized which corresponds to higher breakthrough voltages. At about 100 recesses, the effect on the blocking current is strongly pronounced, the breakdown voltage can be raised about 700 volts. Advantageous widths of the recesses are in the range of 0.1 to 2 $\mu$m and depths of 0.5 to 1 $\mu$m.

It is advantageous when the width of the intervening space 7 is greater than the thickness of the dielectric zone 5. An especial advantage of the lateral three-dimensional structure 6, 7 is that the dielectric zone 5 which in most cases of the art is the recognized type for poor thermal conductivity, for an equivalent blocking capacity of the component can be made thinner than with a comparable component without the structure 6, 7. With a component according to the state of the art, a greater blocking capacity can indeed be obtained by making the dielectric zone 5 thicker but this reduces the characteristics of the component, in a sense reducing the heat dissipation from the active zone of the component. The resulting technological problem of very thick layers 5 as are necessary for components with high blocking voltages has limited their applicability. The problem is especially pronounced in such a use. The thermal dissipation can be optimized by an optimal orientation and correlation of the dielectric zone 5 and the recesses 6 and intervening spaces 7, and especially also by the selection of the materials for the recesses 6 and the intervening spaces 7.

Preferably the recesses 6 are so arranged that the semiconductor material remaining between them is cylinder shaped. A further preferred arrangement has the semiconductor material between the recesses 6 forming ribs.

It is especially advantageous when the recesses 6 extend substantially homogeneously over the cross section of the component parallel to its surface. Then a costly adjustment of the lateral structure with respect to the lateral component is eliminated and the process technology significantly simplified. Basically the lateral structure also can fill out only a part of the cross section of the component.

A further improvement in the blocking capacity can be achieved when the recesses 6 are arranged below the various functional regions of the semiconductor body in different densities. Indeed this results in a loss in part of the advantage of simplified process technology, although it contributes to a further increase in the blocking capacity. It is especially advantageous for the density under one of the main electrodes to be greater than that selected below the drift stretch 2.

The exact dimensioning is dependent on the semiconductor material used, the doping concentrations and the use of the component. For a suitable dimensioning of recesses 6 and intervening spaces 7 it is advantageous that the width of the recesses 6 be held as small as possible so that the greatest possible number of intervening spaces 7 can be formed since the lateral voltage drop across the structure 6, 7 depends principally on the number of channel segments 7.

The voltage which can be accommodated per intervening space 7 increases with the depth of the recesses 6 so that the aspect ratio (ratio of depth to width of the recess 6) should be selected to be as high as possible. Countering this is a corresponding reduction in the effective component thickness in the semiconductor body. The effectiveness of the recesses 6 is especially high in regions of the highest field strength so that an increased density of the recesses 6 in the region below a blocking poled gate in the semiconductor body is advantageous.

Since the oxide thickness of the dielectric zone 5 determines the level of the electric field strength at the lower boundary layer to the substrate 4, the dielectric zone 5 should be made as thin as permitted by its breakdown field strength. It is therefore no longer necessary, according to the invention, to make the zone 5 thicker or to minimize the field strength arising in the semiconductor body 1. Simultaneously the reduced thickness of the zone 5 gives rise to an advantageously improved heat dissipation from the active zone.

In the dimensioning of the intervening spaces 7, the doping concentration of the drift stretch 2 should be noted since in the intervening spaces 7 at which charge carriers of the channel segments can be drawn off, shock ionization can arise which detrimentally influences the blocking characteristic.

In a preferred embodiment according to the invention, an advantageous thickness of the semiconductor body is about 10 μm for a drift stretch 2 of about 140 recesses 6 below the drift stretch 2. The blocking voltage of the component of FIG. 1 is increased above 1100 volts. If intervening spaces 7 are very small, the field strength penetrates less from the substrate side into the semiconductor body. This gives rise to an increased field strength in the vicinity of a blocking poled pn transition in the component of FIG. 1. When the tendency to strictly press the electrical effect of substrate 4 is to be avoided, a width of the intervening spaces 7 is advantageous which is at least so great that a vertical penetration of the field strength from substrate 4 to the surface of the semiconductor body 1 is still possible.

Especially advantageous is the use of the lateral structure 6, 7 in the various variants of components of the IGBT type and also in the various variants of components of the thyrister type.

Figure 3:
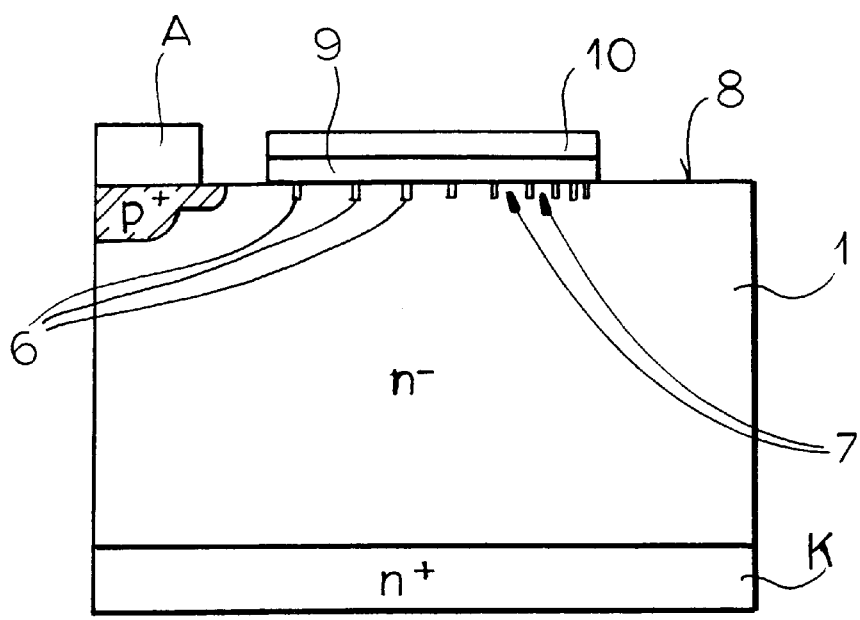
FIG. 3 is a diagram of the component according to the invention with a field-reducing structure.

FIG. 3 shows a further embodiment of the invention in the form of a vertical diode. The illustrated component is a vertical component in which the anode terminal A and the cathode terminal K are located on opposite surfaces of the semiconductor and has a field-reducing structure on the surface. The field-reducing structure is however also usable with lateral components in a comparable way.

The semiconductor body 1 in FIG. 3 has below the anode terminal A a p$^+$-doped region in an n$^-$-doped region of the superconductor body. An n$^+$-doping of the semiconductor body 1 is turned toward the cathode terminal K. A lateral structure with recesses 6 is arranged in the semiconductor body 1 and intervening spaces 7 of the semiconductor region 1 are located between the recesses 6 and the surface of the semiconductor body 1. To avoid obstruction, only several of the recesses 6 and only two of the intervening spaces 7 have been provided with reference characters. The lateral structure 6, 7 forms a field-reducing structure in the effective region of a space-charge zone in the semiconductor body 1 and is thus provided to reduce the field strength at the surface 8. It can be adjacent to a main electrode terminal in a comparable way as with conventional field rings, field plates and other edge structures. Advantageously, the intervening spaces 7 are configured as islets or ribs which are separated by the recesses 6. The dimensioning can be carried out in a comparable way as with the embodiment with lateral components according to FIG. 1. As a reference parameter for advantageous dimensioning, however, the there described lateral drift stretch 2 is replaced by the extent of the space-charge zone determining the maximum theoretical blocking voltage for the doping ratio of the semiconductor 1.

It is advantageous for the width of the recess 6 to be at most 10% of the extent of the space charge zone at the surface 8 of the component and which based upon its doping ratio, determines the maximum theoretical blocking voltage.

It is advantageous further for the width of the intervening space 7 to be at most 30% of the extent of the space-charge zone at the surface 8 of the component which space-charge zone has the maximum theoretical blocking voltage for the doping ratio of the semiconductor body 1.

In an advantageous configuration of the invention, the recesses 6 are homogeneously distributed in the region of the field-reducing structure. The field-reducing structure 6, 7 can however also be located only in selected regions of the surface 8 of the semiconductor body 1.

In a further advantageous embodiment, the distance between the directly neighboring recesses 6, i.e. the width of the intervening spaces 7 diminishes starting from a main blocking transition with increasing distance from the main blocking transition. The field distribution on the surface 8 of the semiconductor body is thus especially advantageously influenced.

In an especially preferred embodiment, the field-reducing structure is arranged below a field plate 10 which is separated from the surface 8 of the semiconductor body 1 by an oxide layer 9. As with the buried dielectric zone 5 of the structure according to FIG. 1, with the field-reducing structure at the surface 8, the spread of the space-charge zone, from which the channel segments are drawn off is determined by the width of the respective intervening spaces 7.

Figure 4:
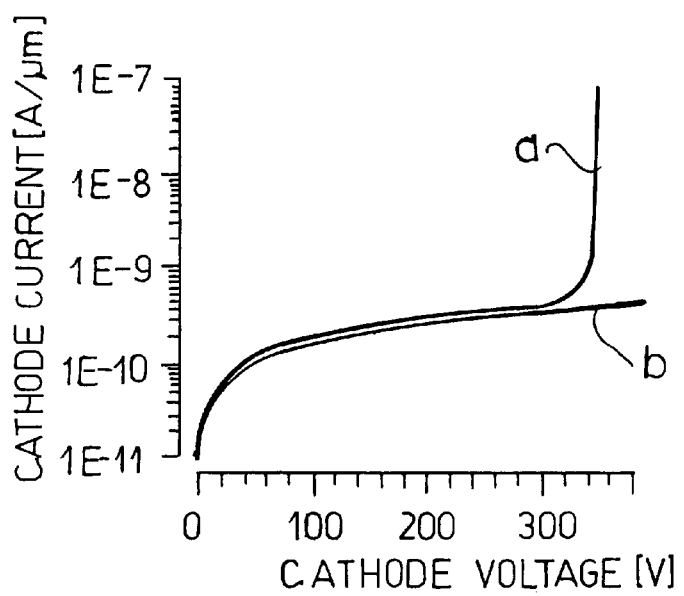
FIG. 4 is a graph of characteristic of the blocking current of a component with the structure according to the invention (b) and without the structure according to the invention (a).

FIG. 4 shows the dependency of the cathode current for the structure of FIG. 3 in comparison to a structure without recesses 6 and intervening spaces 7 below a field-plane 10. While the conventional component structure breaks down at about 340 V, the blocking potential for a component configured according to the invention is shifted to higher values.

Especially advantageous is a combination of a field-reducing structure at the surface of a semiconductor body according to the described type with a buried structure according to FIG. 1 for producing a SOI component with especially improved breakdown voltage.

In a preferred process according to the invention for producing a component with a field-reducing structure at least at certain regions in the surface 8 of the semiconductor body 1 recesses 6 are provided and the recesses 6 are filled with a material which has a higher ohmic property than the semiconductor body 1 in the intervening spaces 7 between the recesses 6 or that the surface 8 of the semiconductor body 1 is coated with an oxide at least in regions and that buried portions 7 are provided in the oxide and are filled with semiconductor material. Then a field plate can be deposited on the structure. It is especially advantageous for the recesses 6 to be filled by oxidation with high ohmic material.

Advantageously, the aspect ratio of breadth and depth of the recesses 6 is so selected that the recesses grow by the oxidation with the oxide which is thus formed. The recesses 6 can however also be filled with the high ohmic material, preferably a dielectric, especially an oxide or also a semi-insulating material. With the components of the invention, components fabricated conventionally can be improved with simple technology so that blocking voltages above 1000 V can be provided. Such components according to the invention can be used advantageously in driver circuits for electronic power-converter systems operated at higher voltages of about 380 V.

We claim:

1. A semiconductor component comprising a semiconductor body and, at least in regions proximal to a surface of the semiconductor body a lateral three-dimensional structure which has recesses extending perpendicular to the surface in the semiconductor body within which the electrical conductivity is smaller than in intervening spaces of the semiconductor body between the recesses.

2. The semiconductor component according to claim 1, wherein the semiconductor component is a lateral component with a substrate bounded by a dielectric zone and between the dielectric zone and the semiconductor body the lateral three-dimensional structure is disposed under at least a portion of the lateral component and is directly in contact with the dielectric zone.

3. The semiconductor component according to claim 1, wherein the three-dimensional structure has islets which are separated by said recesses from one another whereby the electrical conductivity in the recesses is less than that in the islets.

4. The semiconductor component according to claim 1, wherein the three-dimensional structure has ribs which are separated by said recesses from one another, whereby the electrical conductivity in the recesses is less than that in the ribs.

5. The semiconductor component according to claim 2, wherein within the semiconductor body at least in regions thereof, laterally a semiconductor of a further material is arranged which borders on the dielectric zone.

6. The semiconductor component according to claim 2, wherein between the substrate and the dielectric zone at least over regions thereof a lateral semiconductor layer is arranged.

7. The semiconductor component according to claim 2, wherein between the substrate and the dielectric zone at least over regions thereof a lateral insulator layer is arranged.

8. The semiconductor component according to claim 1, wherein said lateral component at least over regions thereof has a width of the recesses in an imaginary sectional plane perpendicular through the lateral component which is smaller than 10% of a lateral drift stretch of the lateral component.

9. The semiconductor component according to claim 1, wherein the width of the intervening spaces between recesses in an imaginary sectional plane perpendicular through the lateral component is somewhat smaller than 30% of a lateral drift stretch.

10. The semiconductor component according to claim 1, wherein said recesses in an imaginary sectional plane perpendicular through the semiconductor component are approximately equidistant.

11. The semiconductor component according to claim 1, wherein a density of said recesses in an imaginary sectional plane perpendicular through the semiconductor component varies.

12. The semiconductor component according to claim 1, wherein at least over regions thereof the depths of the recesses are greater than their widths.

13. The semiconductor component according to claim 2, wherein at least over regions thereof a ratio of the width of the recess and the thickness of the dielectric zone is less than 1.

14. The semiconductor component according to claim 1, wherein at least over regions thereof the width of the recess is less than the width of the intervening spaces between two directly-neighboring recesses.

15. The semiconductor component according to claim 1, wherein said lateral three-dimensional structure lies in regions of the surface of the semiconductor body which have an increased field strength.

16. The semiconductor component according to claim 1, wherein said lateral three-dimensional structure is arranged in a field ring-like arrangement on the surface of the semiconductor body 1.

17. The semiconductor component according to claim 1, wherein the semiconductor component has on the surface additionally a field-reducing structure for reducing a space-charge curvature or electrical surface field strength of the component.

18. The semiconductor component according to claim 1, wherein the recesses are disposed in regions proximal to the surface of the semiconductor body and the recesses have a width that at most is 20% of the spread of a space-charge zone in the semiconductor body on the surface which space-charge zone has the maximum theoretical blocking voltage for the doping ratio in the semiconductor body.

19. The semiconductor component according to claim 1, wherein the width of the intervening spaces separating directly neighboring recesses is at most 30% of the spread of a space-charge zone on the surface, the space-charge zone having the maximum blocking voltage theoretically acceptable based upon the doping ratio in the semiconductor body.

20. The semiconductor component according to claim 1, wherein the spacing between directly neighboring recesses in surface regions of the semiconductor body starting from a main blocking transition diminishes with increasing distance from the main blocking transition.

21. The semiconductor component according to claim 1, wherein the recesses contain a dielectric.

22. The semiconductor component according to claim 1, wherein the recesses contain a semi-insulating material.

23. The semiconductor component according to claim 1, wherein the component is of the IGBT type or of the thyrister type.

24. The semiconductor component according to claim 1, wherein the semiconductor component is a diode.

25. A process for producing a component with a semiconductor and a substrate characterized in that on a surface of the semiconductor body which lies opposite the lateral component, at least over regions thereof, recesses are etched therein, the recesses are then filled with a material which is of higher ohmic than the material between the recesses and are covered with a layer of a dielectric material and the cover layer is at least indirectly bonded with a substrate or with a surface of the semiconductor body provided with a substrate is coated with an oxide, that at least over regions thereof recesses are provided in the oxide, that the recesses are filled with a semiconductor material, that the filled recesses are covered with a layer of a semiconductor material and that the coated layer is bonded at least indirectly to the coating layer.

26. The process according to claim 25, characterized in that the coating layer is planarized before bonding with the substrate (4) or the semiconductor body (1).

27. The process according to claim 25, characterized in that the recesses (6) are filled and covered with the same material.

28. The process according to claim 25, characterized in that the recesses (6) are filled and covered with different material.

29. The process according to claim 28, characterized in that for filling and covering the recesses (6), different dielectric materials or different semi-insulating materials or different semiconductor materials are used.

30. The process according to claim 25, characterized in that the substrate (4) is coated with an oxide or is oxidized before bonding with the cover layer.

31. The process according to claim 25, characterized in that the cover layer before bonding with the substrate (4) is coated with a semiconductor.

32. The process according to claim 25, characterized in that between semiconductor body (1) and the cover layer an additional semiconductor is arranged.

33. A process for producing a component with a field-reducing structure at least according to claim 1 characterized in that at least over regions thereof in the surface (8) of the semiconductor body (1) recesses (6) are formed and that the recesses (6) are filled with a material which is more high ohmic than the semiconductor body (1) between recesses (6) or the surface (8) of the semiconductor body (1) at least for regions thereof is coated with an oxide and in the oxide-buried regions (7) are formed and filled with semiconductor material.

34. The process according to claim 33, characterized in that the recesses (6) are filled with high ohmic material by oxidation.

35. The process according to claim 33, characterized in that the recesses (6) are filled by coating with high ohmic material.

36. The process according to claim 33, characterized in that at least regionally on the recesses (6) a field plate-like structure is deposited.

37. The use of a component with lateral three-dimensional structures according to claim 1, in a driver circuit for power electronic converter systems.

* * * * *